United States Patent
Tomino et al.

(10) Patent No.: US 10,490,438 B2
(45) Date of Patent: Nov. 26, 2019

(54) NON-VOLATILE SEMICONDUCTOR MEMORY DEVICE AND MANUFACTURING METHOD OF P-CHANNEL MOS TRANSISTOR

(71) Applicant: Toshiba Memory Corporation, Tokyo (JP)

(72) Inventors: Hirokazu Tomino, Yokkaichi Mie (JP); Mitsuhiro Noguchi, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 61 days.

(21) Appl. No.: 14/630,462

(22) Filed: Feb. 24, 2015

(65) Prior Publication Data

US 2015/0255475 A1 Sep. 10, 2015

Related U.S. Application Data

(60) Provisional application No. 61/949,603, filed on Mar. 7, 2014.

(51) Int. Cl.
*H01L 21/762* (2006.01)
*H01L 21/8236* (2006.01)
(Continued)

(52) U.S. Cl.
CPC .... *H01L 21/76224* (2013.01); *H01L 21/8236* (2013.01); *H01L 27/11529* (2013.01);
(Continued)

(58) Field of Classification Search
CPC ............... H01L 29/7838; H01L 29/105; H01L 27/11529; H01L 29/1045
(Continued)

(56) References Cited

U.S. PATENT DOCUMENTS 5,266,510 A * 11/1993 Lee ................... H01L 21/26506
    438/298
6,051,482 A * 4/2000 Yang ................... H01L 21/2236
    257/E21.143

(Continued)

FOREIGN PATENT DOCUMENTS

JP     2011-009695     1/2011
JP     2013-069913     4/2013

OTHER PUBLICATIONS https://www.merriam-webster.com/dictionary/below; 2017.*

*Primary Examiner* — Nilufa Rahim
(74) *Attorney, Agent, or Firm* — Kim & Stewart LLP

(57) ABSTRACT

A non-volatile semiconductor memory device includes a memory cell transistor having a memory cell capable of writing and erasing data, and a peripheral circuit that drives the memory cell which includes a first p-channel MOS transistor including a gate electrode that is formed on a semiconductor layer with a first gate insulation film therebetween, a channel region that is formed on a surface of the semiconductor layer and has a first peak dopant concentration, a source region and a drain region that have a second peak dopant concentration higher than the first peak dopant concentration, and overlap regions that extend between the channel region and the source region and the drain region, and also below a portion of the gate electrode, that have a third peak dopant concentration higher than the first peak dopant concentration and lower than the second peak dopant concentration by one order of magnitude or more.

13 Claims, 16 Drawing Sheets

(51) Int. Cl.
*H01L 29/78* (2006.01)
*H01L 29/10* (2006.01)
*H01L 27/11529* (2017.01)

(52) U.S. Cl.
CPC ........ *H01L 29/105* (2013.01); *H01L 29/1045* (2013.01); *H01L 29/7838* (2013.01)

(58) Field of Classification Search
USPC ........................................................ 257/314
See application file for complete search history.

(56) References Cited

U.S. PATENT DOCUMENTS

| | | | | |
|---|---|---|---|---|
| 7,595,243 B1* | 9/2009 | Bulucea | .......... | H01L 21/823807 |
| | | | | 257/E21.618 |
| 2006/0275990 A1* | 12/2006 | Itonaga | ................ | H01L 29/6656 |
| | | | | 438/286 |
| 2010/0301426 A1 | 12/2010 | Kutsukake et al. | | |
| 2011/0108917 A1* | 5/2011 | Shima | ................. | H01L 29/0847 |
| | | | | 257/344 |
| 2011/0133273 A1* | 6/2011 | Shima | ................. | H01L 29/0847 |
| | | | | 257/336 |

\* cited by examiner

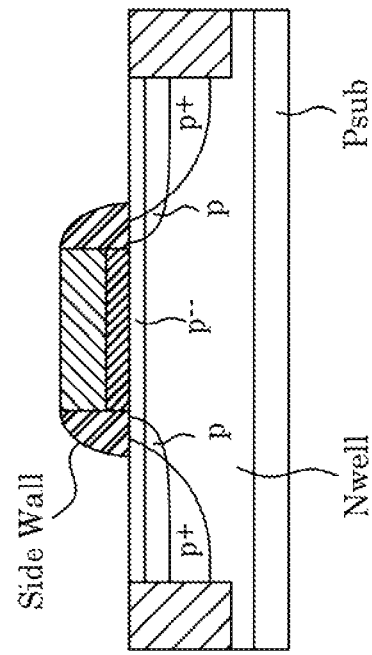
FIG. 16A
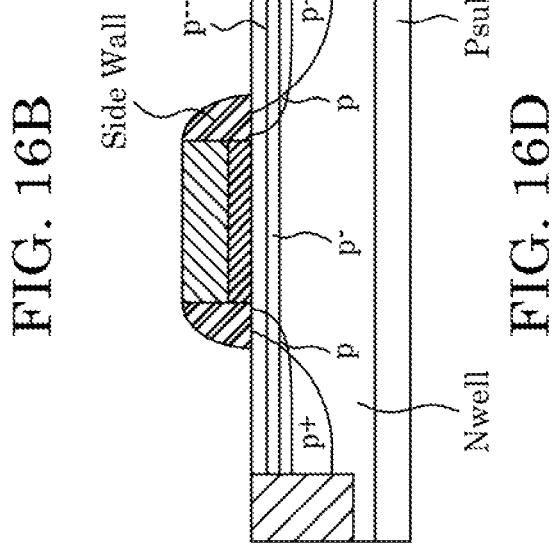
FIG. 16B
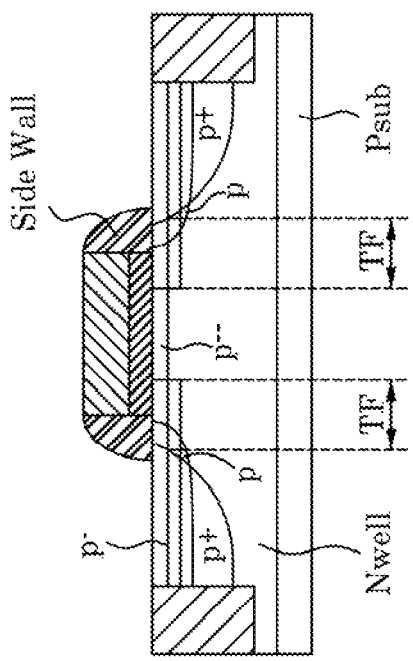
FIG. 16C
FIG. 16D

NON-VOLATILE SEMICONDUCTOR MEMORY DEVICE AND MANUFACTURING METHOD OF P-CHANNEL MOS TRANSISTOR

CROSS-REFERENCE TO RELATED APPLICATION

This application is based upon and claims the benefit of priority from U.S. Provisional Patent Application No. 61/949,603, filed Mar. 7, 2014, the entire contents of which are incorporated herein by reference.

FIELD

Embodiments described herein relate to a non-volatile semiconductor memory device, and a manufacturing method of a p-channel MOS transistor configuring a portion of the non-volatile semiconductor memory device.

BACKGROUND

In a NAND-type flash memory, when data is written and erased in the memory cells, a voltage higher than a power-supply voltage is applied to the control gate line in a selected block of memory cells. To supply this higher voltage, a voltage switching circuit that switches the power-supply voltage to a higher voltage is connected to a row decoder circuit. Such a voltage switching circuit generally includes plural kinds of high withstand voltage enhancement-type or depletion-type MOS transistors or the like.

Voltages of, for example, about 15 V to 40 V, are applied to gates of these transistors when data is being written in a memory cell block. At these voltages, there is a possibility that, over time, the threshold voltages of the transistors will degrade or the current driving capability will be reduced as a result of voltage stress on the gate electrodes and gate insulator, and an increased variation in circuit operation speed, or an increased delay in operation execution time, occurs. One approach to reducing the voltage stress is to increase the thickness of the gate insulation film. As a result, the resistance to voltage stress is enhanced, but the current driving capability of the resulting transistor is decreased.

BRIEF DESCRIPTION OF THE DRAWINGS

FIGS. 16A to 16D are examples of diagrams illustrating various configurations of MOS transistors according to the embodiment (third).

DETAILED DESCRIPTION

A non-volatile semiconductor memory device according to an embodiment includes a memory cell transistor that has a memory cell capable of writing and erasing data; and a peripheral circuit that drives the memory cell transistor, in which the peripheral circuit has a first p-channel MOS transistor including a gate electrode that is formed on a first gate insulation film on a semiconductor layer; a channel region that is formed on a surface of the semiconductor layer and has a first peak dopant concentration; a source region and a drain region that have a second peak dopant concentration higher than the first peak dopant concentration; and overlap regions that are formed directly below an end area of the gate electrode and extend between the channel region and the source region and the drain region, and that have a third peak dopant concentration higher than the first peak dopant concentration and lower than the second peak dopant concentration by one order of magnitude or more.

Figure 1:
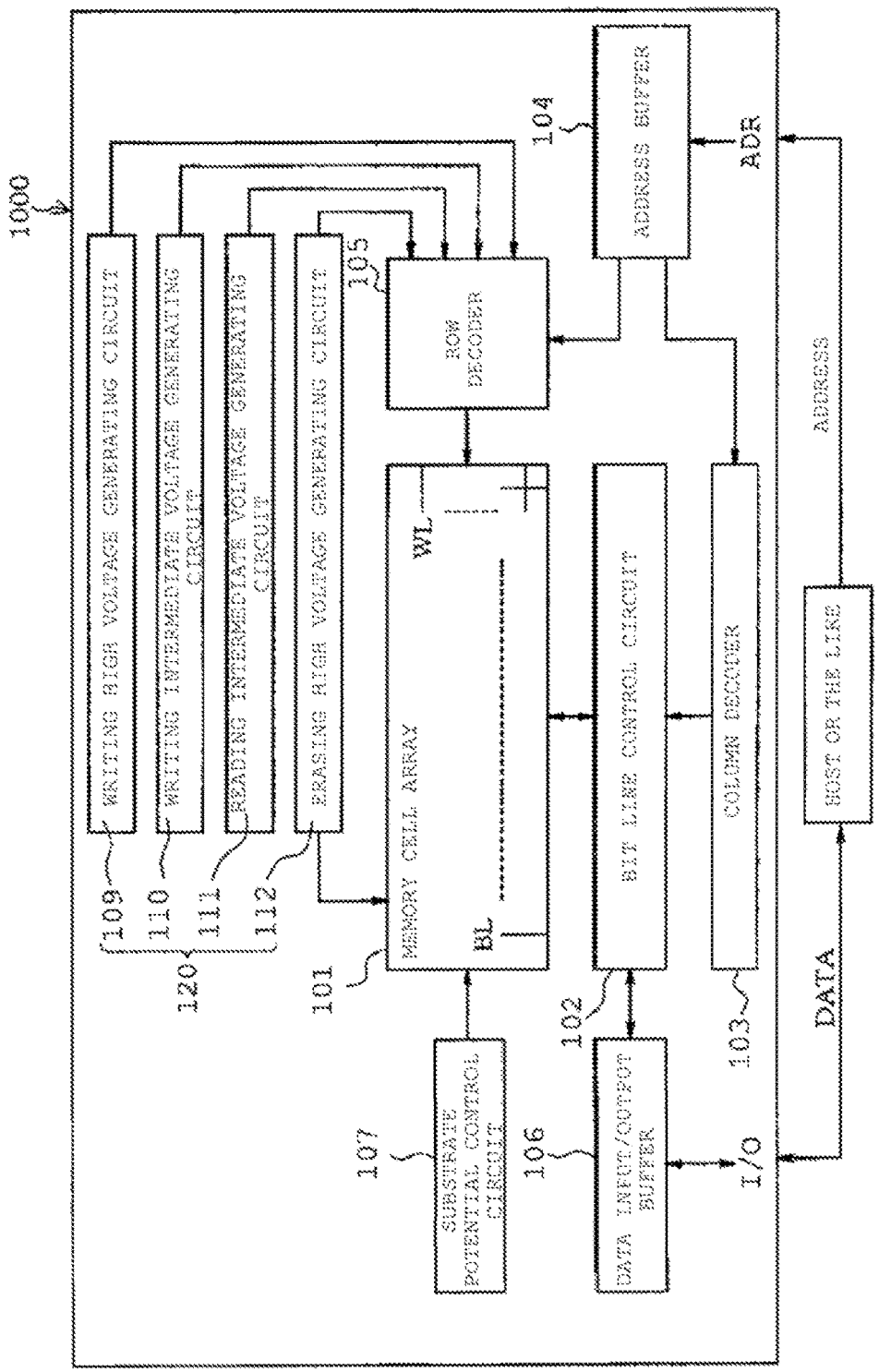
FIG. 1 is an example of a block diagram schematically illustrating a configuration of a NAND-type flash memory according to an embodiment.

Hereinafter, an embodiment is described with reference to the drawings. FIG. 1 is an example of a block diagram schematically illustrating a configuration of a NAND-type flash memory 1000. The NAND-type flash memory 1000 receives data, an address, and a command from a host or the like, writes data on a memory cell array 101 according to the received command, and reads data from the memory cell array 101. A bit line control circuit (sense amplifier and data latch) 102 is provided in order to write, read, and rewrite data, and perform verify read with respect to the memory cell array 101. The bit line control circuit 102 is connected to a data input/output buffer 106, and receives data output from a column decoder 103 that receives an address signal from an address buffer 104, as an input.

The memory cell array 101 is provided with a row decoder 105 for controlling a control gate and a selection gate operation, and a substrate potential control circuit 107 for controlling potentials of a p-type silicon substrate (or a p-type well region) on which the memory cell array 101 is formed. Four kinds of voltage generating circuits 120 generate voltages that are supplied to a memory cell or the like and are required for writing, reading, or the like. Specifically, a writing high voltage generating circuit 109 and a writing intermediate voltage generating circuit 110 respectively generate a writing high voltage Vpp (to 20 V) and an intermediate voltage Vmg (to 10 V) at the time of the data writing operation.

A reading intermediate voltage generating circuit 111 generates a reading intermediate voltage Vread when reading data from the memory cells. An erasing high voltage generating circuit 112 generates an erasing high voltage Verase (up to 20 V) at the time of an erasing operation.

The bit line control circuit 102 is mainly configured with a CMOS flip flop, and performs a sense operation for reading the voltage potential of a latch or a bit line for data to be written, a sense operation for the verify read after writing data, and a latch operation on the rewritten data. Further, in the configuration illustrated in FIG. 1, circuits other than the memory cell array 101 correspond to peripheral circuits, i.e., they are separate from the memory cell array 101.

Figure 2:
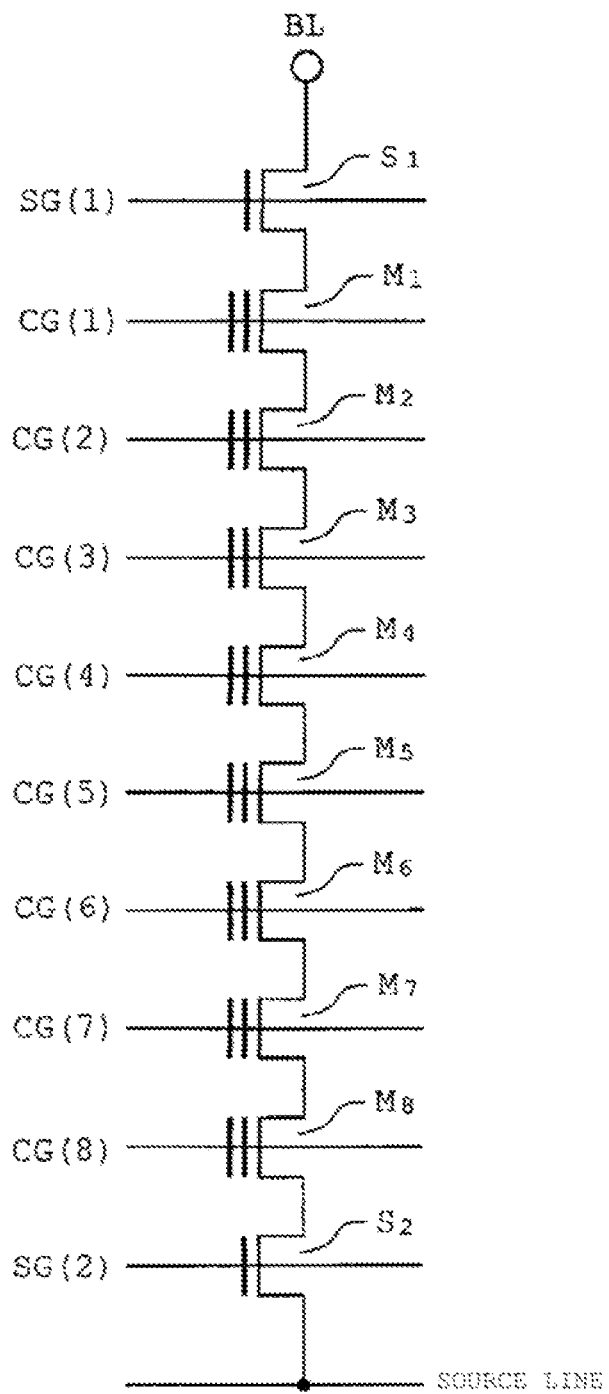
FIG. 2 is a diagram illustrating an equivalent circuit of one NAND cell portion in a memory cell array according to the embodiment.

FIG. 2 is a circuit diagram of an equivalent circuit of one NAND cell portion in the memory cell array 101. The configuration of the memory cells M1 to M8 are not illustrated, but each has a floating gate formed on a gate insulation film on a semiconductor substrate, and control gates (word lines) are formed on an insulation film thereon. Respective memory cells are connected in series, such that the N-type diffusion layers forming the drains and sources of the memory cells are connected between neighboring memory cells, and the source of one cell is formed as the drain of the adjacent cell, and vice versa.

Further, for easier description, according to the embodiment, 8 memory cells are provided in one NAND cell, but the configuration is not limited thereto. Generally, NAND cells having 16, 32, 64, and 128 memory cells which are multiples of 8 are provided, and one or more dummy memory cells for alleviating the voltage (electric field) may be formed on the end portion of the NAND cell.

Selector transistors S1 and S2 are formed respectively adjacent the memory cells M1 and M8 of the NAND cell. A bit line BL is connected to a drain on one end (memory cell M1 side) of the NAND cell. The control gates of the NAND cells in adjacent, parallel, NAND cells are commonly disposed as control gate lines CG(1), CG(2), . . . , and CG(8). These control gates are word lines. The selector gates SG(1) and SG(2) of the Selector transistors S1 and S2 are also disposed in the same direction together with the control gate lines.

Figure 3:
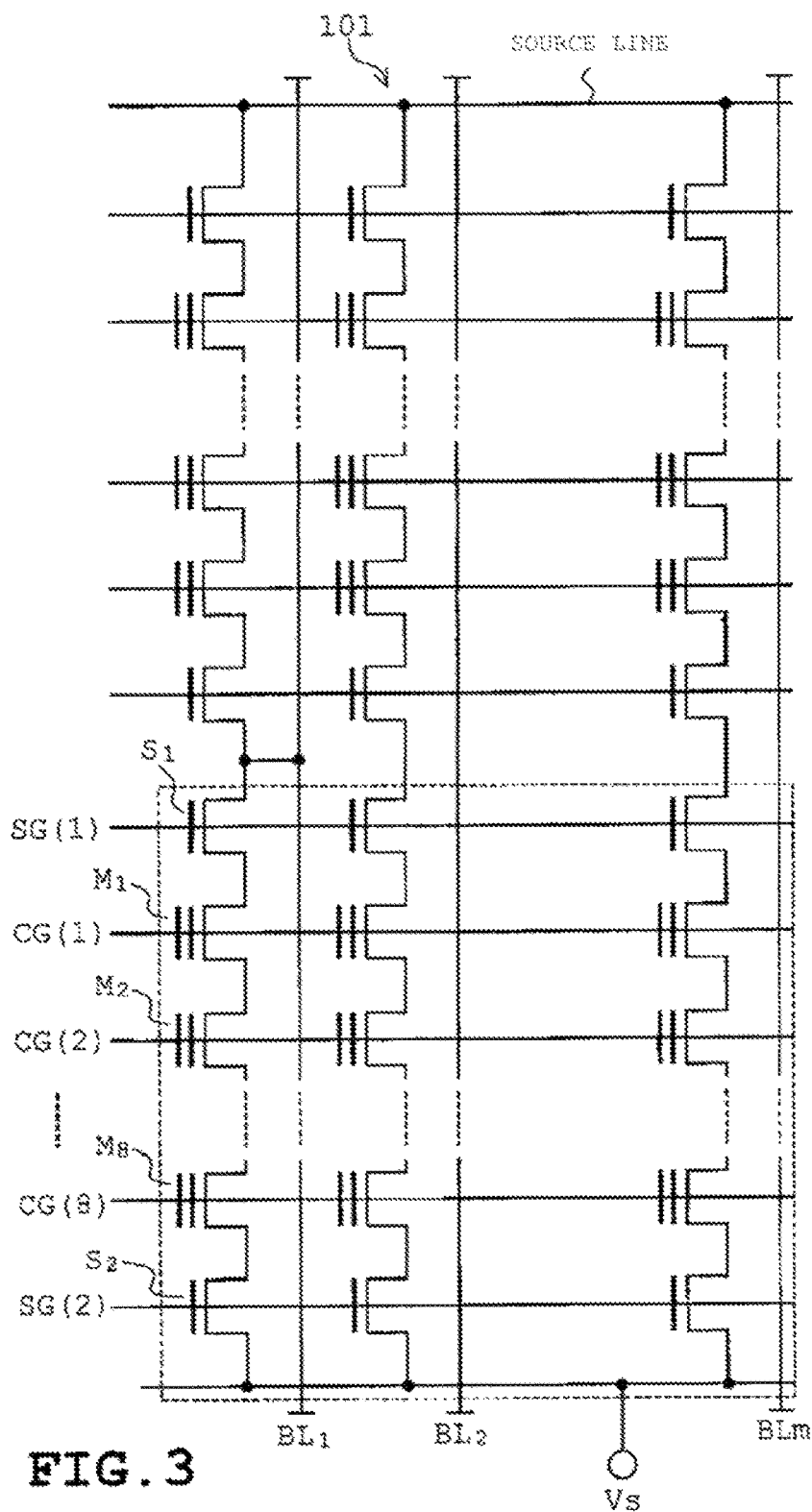
FIG. 3 is a diagram illustrating the equivalent circuit of the memory cell array in which NAND cells are disposed in a matrix shape according to the embodiment.

FIG. 3 is a diagram illustrating the equivalent circuit diagram of the memory cell array in which the NAND cells are disposed in a matrix shape. In the NAND cell group in which same word line and the same selector gate lines are common, a region enclosed with broken lines in FIG. 3 is called one block. One of the pluralities of blocks may be selected at the time of the erase operation (called selection block).

Figure 4:
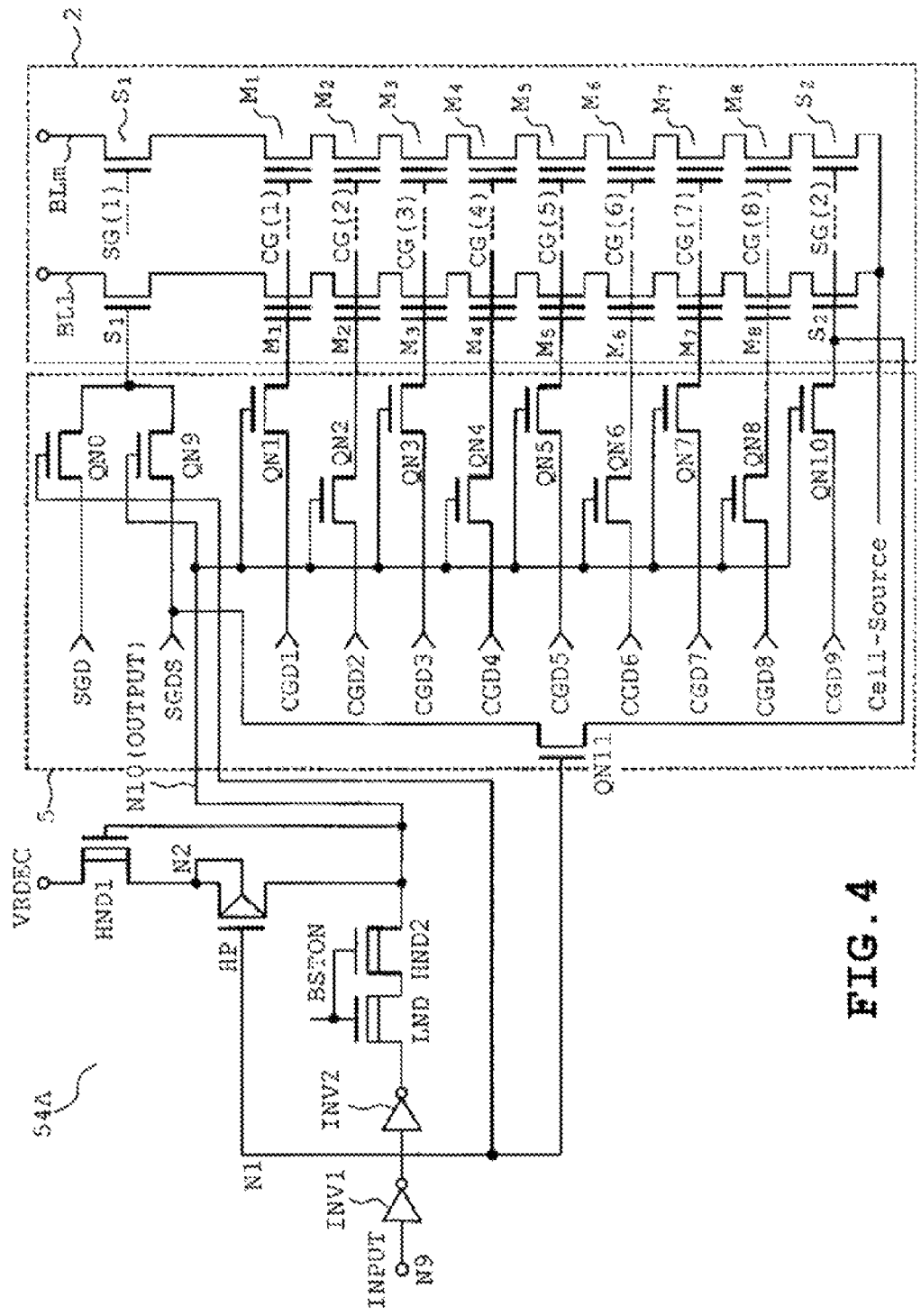
FIG. 4 is an example of a circuit diagram illustrating a configuration of a row decoder according to the embodiment.

FIG. 4 is an example of a diagram illustrating a configuration of the row decoder 105. FIG. 4 illustrates an example in which a row decoder circuit 5 configuring the row decoder 105 is disposed on one side of a memory cell block 2 in the memory cell array 101. The row decoder circuit 5 includes transfer transistors QN0 to QN11 (threshold voltage is Vth (QN)) which are connected to the control gate lines CG(1) to CG (8) and the selector gate lines SG(1) and SG (2). In the circuit illustrated in FIG. 4, the MOS transistors QN0 to QN11 connected to the control gate lines CG(1) to CG(8) and the selector gate lines SG(1) and SG(2) are all enhancement-type (E-type) and n-channel-type. Further, the transistors QN1 to QN8 are respectively connected to the control gate lines CG(1) to CG (8). That is, one transistor QN is connected to one control gate line.

That is, current paths of the NMOS transistors QN1 to QN8 are connected between the control gate lines CG(1) to CG(8) and signal input nodes CGD1 to CGD8 thereof, respectively. Further, the current paths of the NMOS transistors QN0 and QN9 are connected to the selector gate line SG(1) and respectively between signal input nodes SGD and SGDS. Additionally, the current paths of the NMOS transistors QN10 and QN11 are connected between the selected gate line SG(2) and the signal input nodes SGS and SGDS thereof.

A voltage switching circuit 54A (level shifter circuit) switches voltages of the control gate lines CG(1) to CG(8) and the selector gate lines SG(1) and SG(2) by setting gate voltages of the NMOS transistors QN0 to QN11. The voltage switching circuit 54A outputs output voltages OUTPUT with different amplitudes to an output node N10 according to the switching of input voltages INPUT and control signals BSTON. The input voltage INPUT is a power-supply voltage Vdd if the voltage switching circuit 54A selects the connected memory cell block 2, and is a reference voltage Vss, if the voltage switching circuit 54A does not select the connected memory cell block 2. Further, an inverting signal/INPUT of the input voltage INPUT is input to a node N20, that is to a gate of the transistors QN9 and QN11. According to this, any one side of the transfer transistors QN0 and QN9 is charged, and any one side of the transfer transistors QN11 and QN9 is also charged.

Further, in FIG. 4, instead of one of the n-channel MOS transistors QN0 to QN10, one transfer gate structured by connecting the p-channel MOS transistor and the n-channel MOS transistor in parallel, may be formed for one control gate or one selector gate.

The voltage switching circuit 54A includes a transistor HND1 between the output node N10 and a power-supply node VRDEC, and a transistor HP connected to the transistor HND1 in series through a node N2 (a source of the transistor HND1). The transistor HND1 is a high withstand voltage depletion-type (D-type) n-channel MOS transistor, and the threshold voltage Vth (HND1) has a negative value. The transistor HP is a high withstand voltage enhancement-type (E-type) p-channel MOS transistor, and the threshold voltage Vth (HP) has a negative value.

In the transistor HND1, the drain is connected to the power-supply node VRDEC, the source is connected to the source of the transistor HP in the node N2, and the output voltage OUTPUT is positively fed back to the gate. In the transistor HND1, since high voltages are applied between the source and the drain and between the source and the gate, high withstand voltage properties are required. Therefore, a distance between the gate and the contact is longer than the distance between the gate and the contact in a low withstand voltage transistor (LND or the like to be described below), and also the gate insulation film is thicker than that of the low withstand voltage transistor. Further, when high voltage Vpp is applied to the power-supply node VRDEC and the gate, the threshold voltage Vth (HND1) is set as a negative value (D-type), so that the voltage Vpp may be transferred to the node N2.

In the voltage switching circuit 54A, inverter circuits INV1 and INV2, a low withstand voltage D-type N-channel MOS transistor LND (that is, having the negative threshold voltage Vth (LND)) and a high withstand voltage D-type N-channel MOS transistor HND2 (the negative threshold voltage Vth (HND2)) are connected in series between the output node N10 and a node N9 to which the input voltage INPUT is input. The control signal BSTON is applied to the gates of the transistor LND and the transistor HND2 so as to configure a switching circuit as a whole. Here, the thickness of the gate insulation film of the low withstand voltage transistor is from, for example, 1 nm to 10 nm, and the thickness of the gate insulation film of the high withstand voltage transistor is from, for example, 15 nm to 40 nm.

In order to apply high voltage to the node N10 at the time of writing to the memory cells M1 to M8, a voltage, for example, equal to or greater than 2 V, is applied to the gate of transistor HP so that the transistor HP is in a cutoff condition. Further, the transistors HND2 and LND are opened, and then the node N10 is at 0 V. Then transistors HND2 and LND are cut off. Then, a voltage higher than the writing voltage Vpp (from 5 V to 30 V) is applied to the node VRDEC.

At this point, a voltage drop occurs at the node N2 based on the threshold of the transistor HND1, and, for example, a voltage of about 2 V to 5 V is output. Accordingly, if the gate voltage of the transistor HP is higher than a voltage obtained by subtracting the threshold voltage of the transistor HP from the voltage of the node N2, the transistor HP is maintained in the cutoff state. Further, in a block in which the writing voltage Vpp is applied to the node N10, the transistor HP is set to be in the conducting (open) state by selectively setting a node N1 to be at 0 V.

When the transistor HP is in the conducting state, the gate voltage of the transistor HND1 increases. Therefore, the potential of the source and the drain of the transistor HP increase to the voltage of the node VRDEC. As a result, the potential of the node N10 changes from 0 V to the voltage of the node VRDEC, that is, the range of the input voltage INPUT of the voltage switching circuit 54A changes to be 3 V or less. Accordingly, it is possible to change the potential of the node N10 to the range of 10 V so that the level of the voltage is switched.

Here, if the transistors HND1 and HP are in the conducting state, the potentials in the source and the drain of the transistor HP increase to about the voltage of the power-supply node VRDEC. However, since the gate voltage of the transistor HP becomes 0 V, high voltage stress is applied to the gate insulation film of the transistor HP. As a result of repeated voltage stress, the threshold voltage for switching the transistor HP is increased, and the current driving capability of the transistor HP is decreased.

If the current driving capability of the transistor HP decreases, the speed at which the potential of the node N10 changes from 0 V to VRDEC (rising speed) decreases, in other words, the switching time is longer. Therefore, the pulse width of the voltage pulse reaching the memory cells and the selector gates for writing and reading data decreases over time. As a result, the inventors of the application found that the writing threshold value of the memory cell is likely to decrease if the writing voltage is not sufficiently supplied to the memory cell.

Since the low voltage generated at the output node N10 is applied to the gate electrode, it is required that the transistor HND1 has high intrinsic withstand voltage so that the transistor is not destroyed when a large voltage difference exists between the drain and gate thereof. Meanwhile, since the potential difference between the source and the drain is not so great, the soft breakdown withstand voltage is not required to be high. On the other hand, when the transistor HND2 is in the OFF state, the potential difference between the source and the drain increases, so the soft breakdown withstand voltage is required to be high.

The voltage switching circuit 54A is configured with D-type n-channel MOS transistors HND1 and HND2, and E-type p-channel MOS transistor HP, as high withstand voltage MOS transistors. Meanwhile, the MOS transistors QN0 to QN11 in the row decoder circuit 5 are E-type n-channel MOS transistors. That is, the peripheral circuit that controls the memory cell array 101 includes various forms of high withstand voltage MOS transistors. Especially, the high withstand voltage property is required for the transistor HP as described above.

Figure 5:
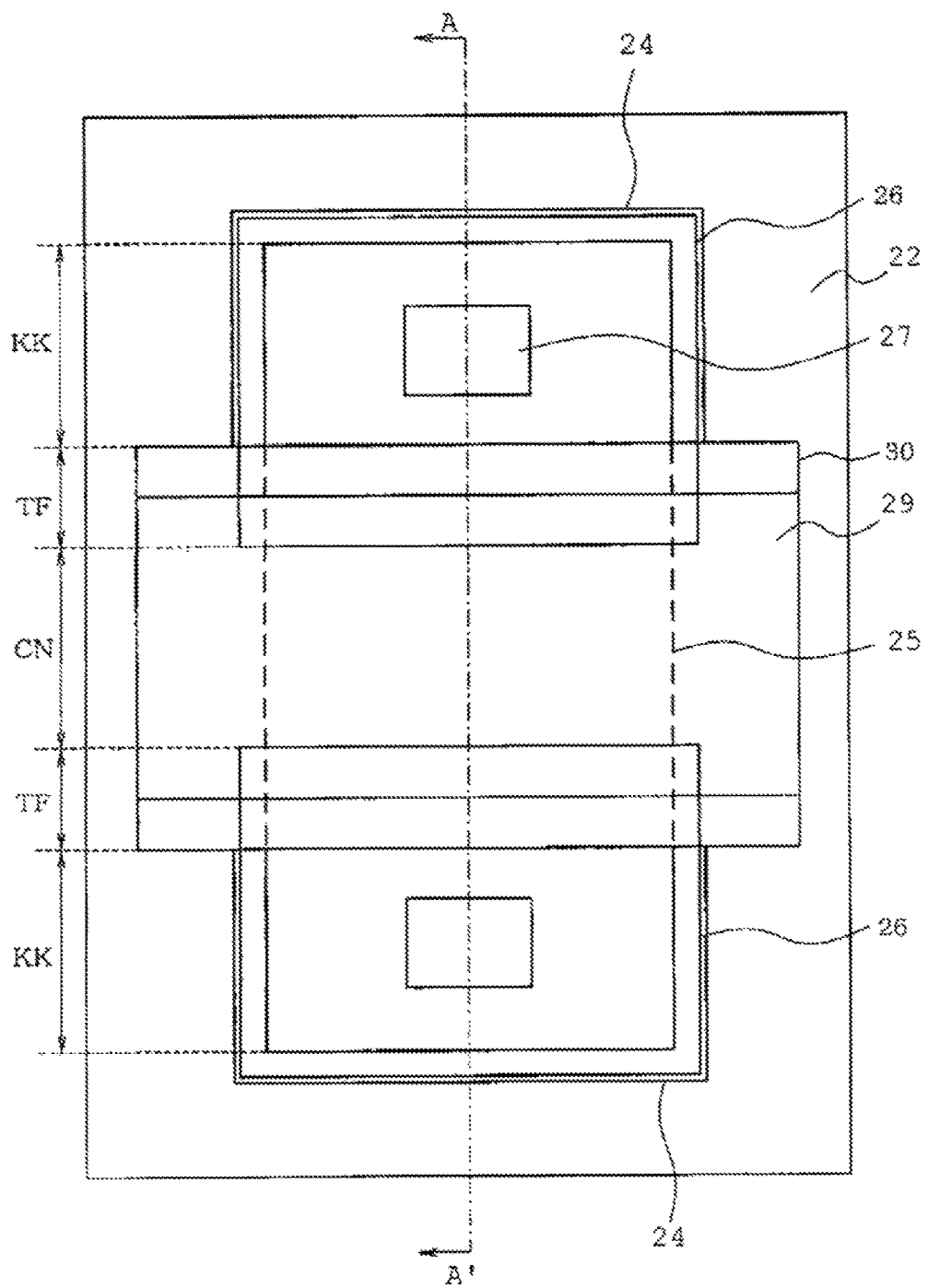
FIG. 5 is an example of a plan view schematically illustrating a configuration of a high withstand voltage p-channel MOS transistor according to the embodiment.

Channel ion implantation, for adjusting threshold voltages, is performed on these transistors. Generally, to dope the channel region, channel ion implantation for the p-channel MOS transistor is performed on the surface of the semiconductor layer in the portion thereof directly below the gate electrode 29 (FIG. 5). For example, p doping ions of boron (B), indium (In), and the like are implanted into the semiconductor layer (or substrate). The gate insulation film and the gate electrode 29 are then formed over the doped channel, and ion implantation is performed to dope the source and drain regions using the gate electrode 29 as a self-aligned mask.

Figure 6:
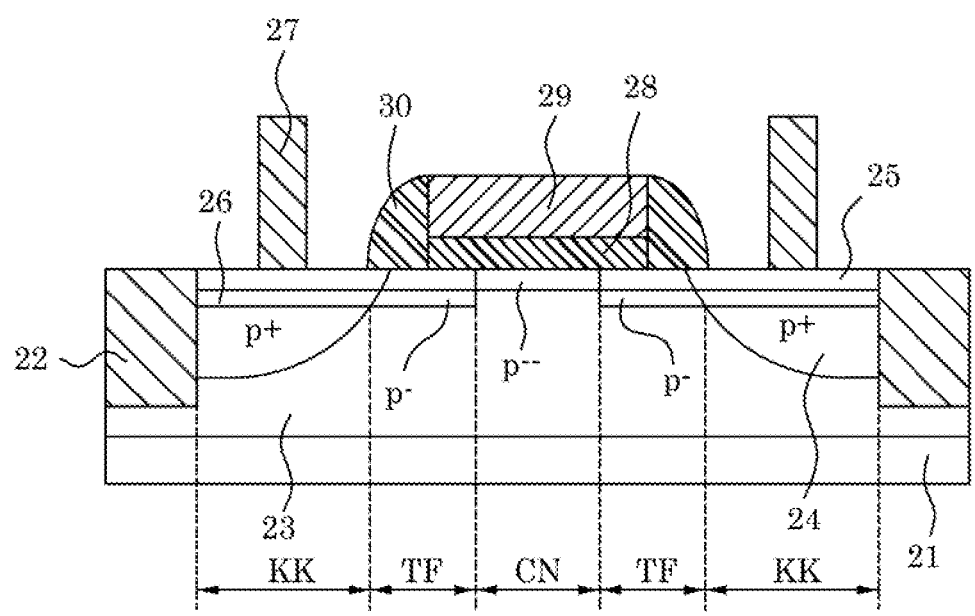
FIG. 6 is an example of a cross-sectional view illustrating the configuration of the high withstand voltage p-channel MOS transistor according to the embodiment.

FIG. 5 is a schematic diagram illustrating a plan layout of the p-channel MOS transistor corresponding to the transistor HP, and FIG. 6 is a cross-sectional view taken along line A-A shown in FIG. 5. As illustrated in FIGS. 5 and 6, the transistor HP according to the embodiment is provided with an activated region, which is surrounded by Shallow Trench Isolation (STI) element separation insulation film 22 extending into an isolation trench in a p-type semiconductor substrate 21, and the activated region is implanted as an n-type well 23.

P$^+$ source drain diffusion regions 24, a p$^{--}$ channel region CN, and p$^-$ implantation regions 26 are formed inside the n-type well 23. P$^+$ contact electrodes 27 are formed to extend upwardly from the surfaces of the source drain diffusion regions 24. Here, symbols "+" and "−" subsequent to "n" denote a relative dopant concentration, and it is denoted that the n$^+$ has a dopant concentration higher than n, n$^-$ has a dopant concentration lower than n, and n$^{--}$ has a dopant concentration lower than n$^-$.

The gate electrode 29 is formed on the surface of the semiconductor substrate 21 over a gate insulation film 28 disposed therebetween. Further, for example, the semiconductor substrate 21 is p-type, but the transistor HP may be formed on the n-type semiconductor substrate.

The source drain diffusion regions 24 are formed by performing the self-aligned ion implantation using the gate electrode 29 and side wall insulation films 30 as a self aligned mask. For example, boron (B) may be implanted as a p-type dopant to form the source and drain regions KK. The channel region CN is a region in which a p$^{--}$ region 25 is located directly below the gate electrode 29 and the gate insulation film 28. The source and drain diffusion regions KK are regions in which the p$^{+}$ regions 24, the p$^{--}$ region, and the p$^{-}$ regions 26 are form in a stack, and are formed directly below the contact electrodes 27. Further, the end portions of the source drain diffusion regions KK are positioned near the end portions of the side wall insulation films 30.

Overlap regions TF are disposed between the source drain diffusion regions KK and the channel region CN on the source side, and between the source drain diffusion regions KK and the channel region CN on the drain side. The overlap regions TF are regions in which the p$^{--}$ region 25 and the p$^{-}$ regions 26 overlap each other, but the p$^{+}$ regions 24 do not extend from the source drain regions KK. Further, the overlapping regions TF are formed directly below the side wall insulation films 30, and are formed to protrude under the gate insulation film 28 and gate 29 by 50 nm or more from the borders of the gate electrode 29 and the side wall insulation films 30. The overlap region TF on the source side and the overlap region TF on the drain side are not connected to each other. Further, as shown in FIG. 6, the source drain diffusion regions KK may extend to the outer edge of the side wall insulation films 30. Alternatively, the diffusion regions KK may extend to the gate electrode 29. Dopants of the p$^{--}$ region 25 are, for example, boron (B). Further, in order to cause the implantation depth of the p$^{--}$ region 25 to be shallow, the implantation energy at the time of forming the p$^{--}$ region 25 is set to be less than the implantation energy at the time of forming the p$^{+}$ regions 24 which are formed only in the source drain diffusion regions KK.

When viewed from above, the p$^{-}$ regions 26 protrude toward the gate electrode 29 further than the p$^{+}$ regions 24, so the overlap regions TF are formed only in the portions in which the p$^{--}$ region 25 and the p$^{-}$ regions 26 are overlapped. Dopants used for the ion implantation on the overlapping regions TF are, for example, boron (B). In order to cause the implantation depths of the p$^{-}$ regions 26 to be shallow, the implantation energy for forming the p$^{-}$ regions 26 is set to be less than the implantation energy for forming the p$^{+}$ regions 24 which are formed only in the source drain diffusion regions KK. Further, the ion implantation may be performed to dope the contact electrodes 27 formed on the surface of the source drain diffusion regions 24. At this point, the dopants are, for example, boron (B).

Maximum values of dopant concentrations (peak dopant concentrations) and the junction depths for respective portions are, for example, as follows.

|  | Peak concentration [cm$^{-3}$] | Junction depth |
| --- | --- | --- |
| p$^{--}$ region 25 | 1E+17 to 1E+18 | 300 nm or less |
| n-type well 23 |  | 1 μm to 3 μm |
| p$^{-}$ region 26 | 1E+17 to 1E+19 | 250 nm or less |
| p$^{+}$ region 27 | 1E+19 to 1E+20 | 300 nm or less |

Figure 7A:
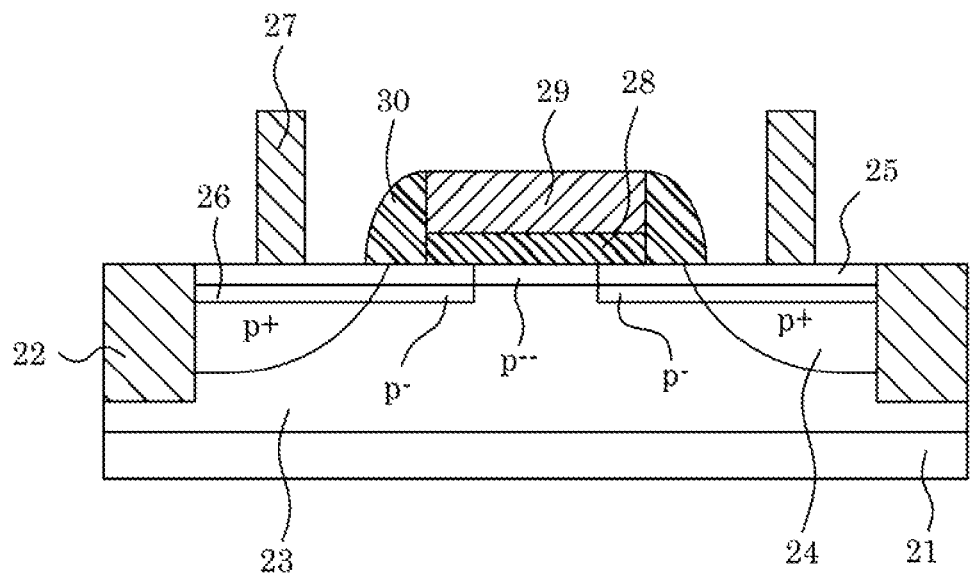
FIG. 7A is a diagram corresponding to FIG. 6.
Figure 7B:
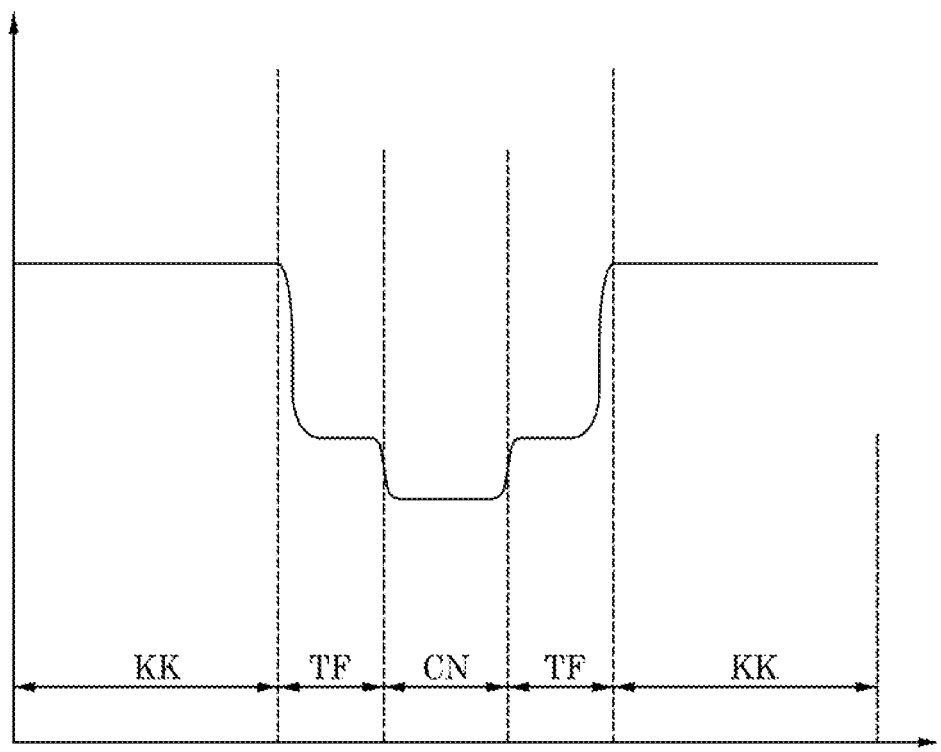
FIG. 7B is an example of illustrating a distribution state of dopant peak concentrations of the high withstand voltage p-channel MOS transistor according to the embodiment.
Figure 8A:
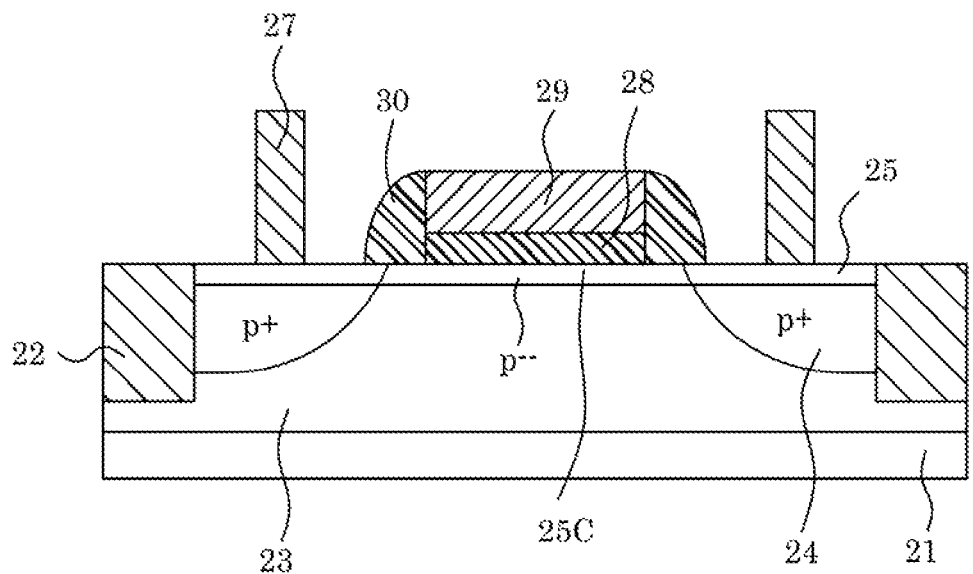
FIG. 8A is a diagram corresponding to FIG. 6 illustrating a second high withstand voltage p-channel MOS transistor.
Figure 8B:
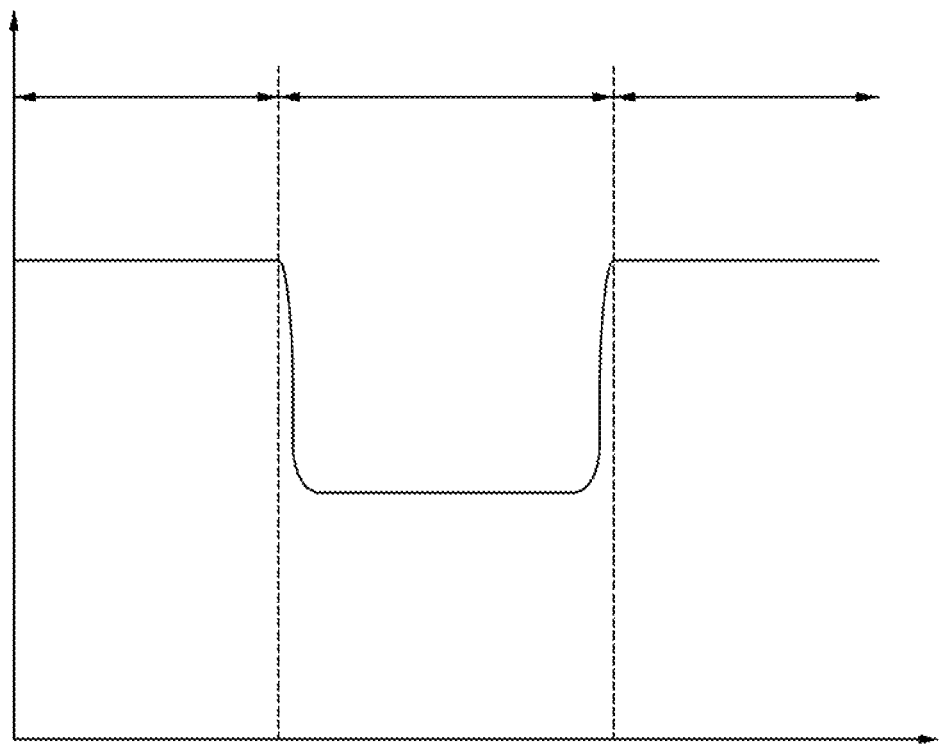
FIG. 8B is an example illustrating a distribution state of dopant peak concentrations of the second high withstand voltage p-channel MOS transistor according to the embodiment.

Subsequently, FIGS. 7A and 7B are diagrams illustrating a distribution state of the peak concentrations of the transistor HP illustrated in FIGS. 5 and 6. Here, the dopant concentration distribution in FIG. 7B is the peak dopant concentration distribution near the surface layer of the semiconductor substrate 2 (about 10 nm to 100 nm from the surface layer). The vertical axis indicates p-type dopant concentrations. Toward the upper side of the vertical axis, the p-type dopant concentration is higher, and toward the lower side, the p-type dopant concentrations are lower. In addition, the vertical axis is on a log scale. Further, the ends of the horizontal axis represent the gate electrode side of the side wall insulation films 30. In addition, FIGS. 8A and 8B are diagrams illustrating the distribution state of the peak concentrations of a second p-channel MOS transistor that does not have the overlap regions TF. As clearly illustrated in the drawings, the concentrations of the p-type dopants in the portions in which the overlap regions TF are present on both ends of the channel region CN in the transistor HP is higher than that in the second p-channel transistor. In addition, the p-type peak dopant concentrations of the overlap regions TF decrease in a curve shape from the source drain diffusion regions KK to the channel region CN, and the curve has step portions in the middle. The peak dopant concentrations of the step portions are greater than about several times (less than one power of 10) of the peak dopant concentration of the channel region CN. Meanwhile, the peak dopant concentrations of the source drain diffusion regions KK are greater than the peak dopant concentrations of the step portions by one power of 10 or more.

Figure 9:
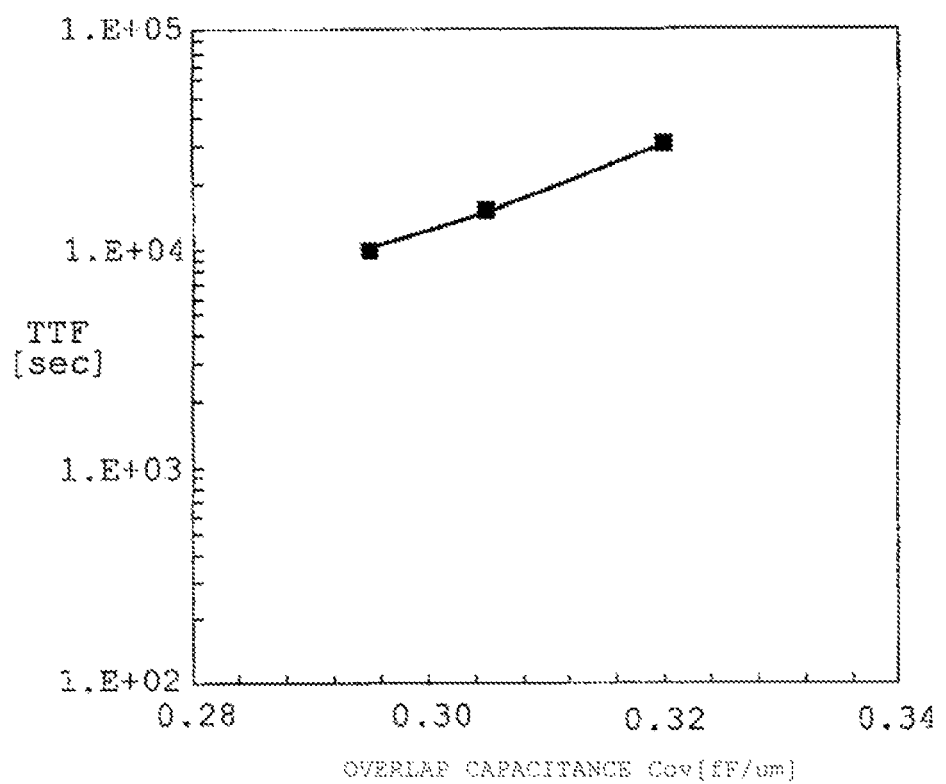
FIG. 9 is an example of a diagram illustrating a relationship between capacitances between a gate/a source and a drain which are formed on both ends of the channel region of the high withstand voltage p-channel MOS transistor and stress application times until the threshold value changes by 50 mV when the voltage stress is applied to the transistor according to the embodiment.

FIG. 9 is a diagram illustrating a relationship between capacitances (overlap capacitances) between the gate/the source and the drain which are formed on both ends of the channel region 25CN of the transistor HP and the stress application times (Lifetime TTF: Time To Failure) until the threshold value changes, for example, by 50 mV when the aforementioned voltage stress is applied. According to this, the inventors of this application found the tendency that the lifetime increases as the overlap capacitance increases.

Here, it may be considered that the injection of holes to the gate electrode end in the source drain direction of the gate insulation film 28 is prevented by causing the region overlapped with the p-type diffusion layer and the gate electrode to be large. That is, the change of the threshold value of the transistor or the decrease of the current driving capability is prevented by preventing the injection of the holes to the end portion of the gate insulation film 28 as a result of the voltage stress. Accordingly, it is preferable that an element that provides higher gate withstand voltage is used as the transistor HP, by employing the configuration illustrated in FIGS. 6 to 7B.

That is, the overlap capacitance is set to be large by forming the overlap regions TF directly below the end portion of the gate electrode 29. Meanwhile, the p-type peak dopant concentration of the overlap region TF is smaller than the p-type peak dopant concentration of the source drain diffusion region KK. As a result, the surface withstand voltage is not reduced.

Further, the overlap region TF is set to extend 50 nm or more from the end portion of the source drain diffusion region KK for the following reasons and thus extend under the gate electrode 29. If the overlap region TF is shorter than the lower limit of 50 nm, the aforementioned positive effect obtained by providing the overlapping region TF may be decreased. Further, the upper limit of the overlapping region TF protruding from the end portion of the gate electrode 29 is a range that does not cause the withstand voltage between the source and the drain to be smaller than that desired by causing the overlapping regions TF to come too close to each other under the gate electrode 29 and thus reduce the effective length of the channel.

Meanwhile, in the configuration illustrated in FIGS. 5 and 6, since the overlap capacitance between the gate electrode and the source drain diffusion layer (the overlapping region TF) is large, the configuration is not suitable for a transistor that performs a high speed switching operation. Accordingly, the configuration illustrated in FIGS. 5 and 6 may be employed as, for example, the high withstand voltage transistor HP in which the high voltage is not applied between the gate electrode and the source drain diffusion layer for a long period of time, which uses the configuration of the second pMOS transistor for the transistor that performs a high speed operation, and which is used in the voltage switching circuit 54A.

Figure 10:
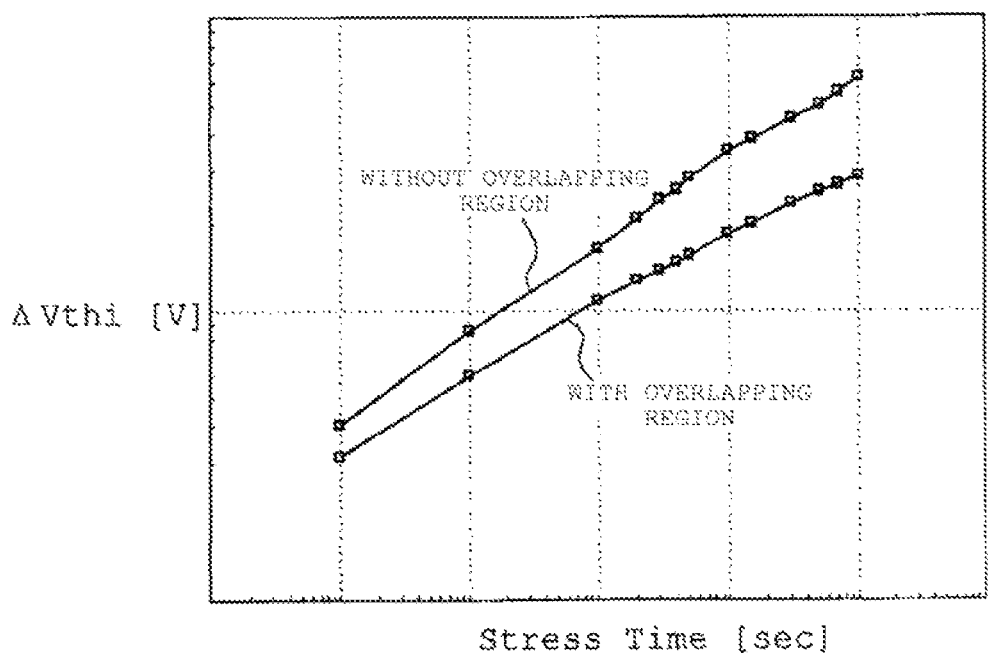
FIG. 10 is an example of a diagram illustrating variation amounts of the threshold value voltages in the course of time in a state in which voltage stress is applied with respect to a high withstand voltage p-channel transistor according to the related art and the high withstand voltage p-channel transistor according to the embodiment.

FIG. 10 is a log-log scale graph illustrating the change of the threshold voltages over time in which voltage stress is applied to the second high withstand voltage p-channel transistor that does not have the overlap regions TF and the high withstand voltage p-channel transistor that has the overlapping regions TF according to the embodiment. As clearly illustrated in the drawings, the high withstand voltage p-channel transistor that has the overlap regions TF has a smaller change of the threshold voltage than the second high withstand voltage p-channel transistor.

Figure 11A:
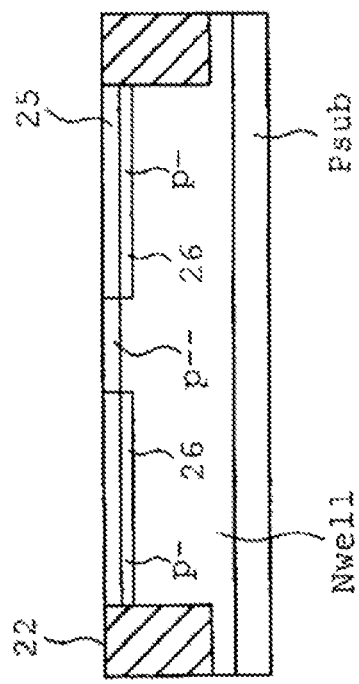
FIGS. 11A to 11D are examples of diagrams illustrating manufacturing methods of various MOS transistors according to the embodiment (first).
Figure 11B:
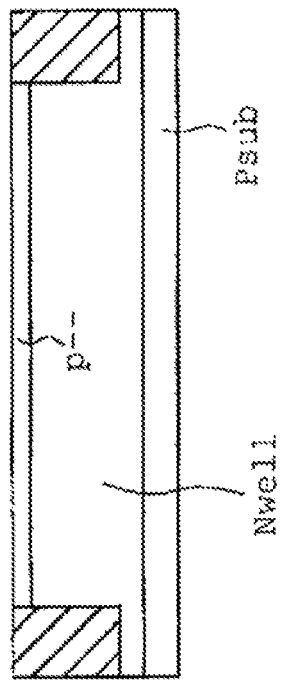
Figure 11C:
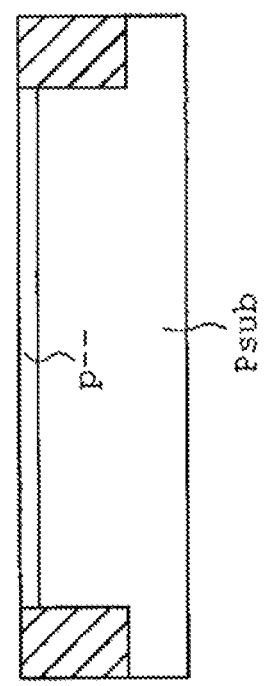
Figure 11D:
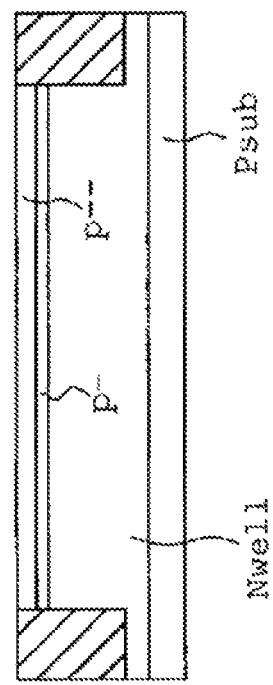
Figure 12A:
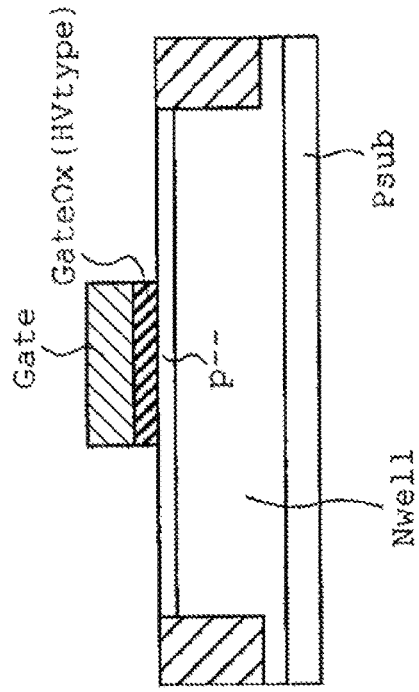
FIGS. 12A to 12D are examples of diagrams illustrating manufacturing methods of various MOS transistors according to the embodiment (second).
Figure 12B:
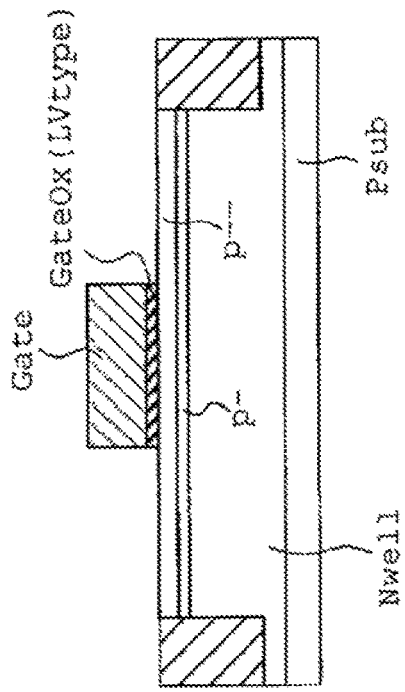
Figure 12C:
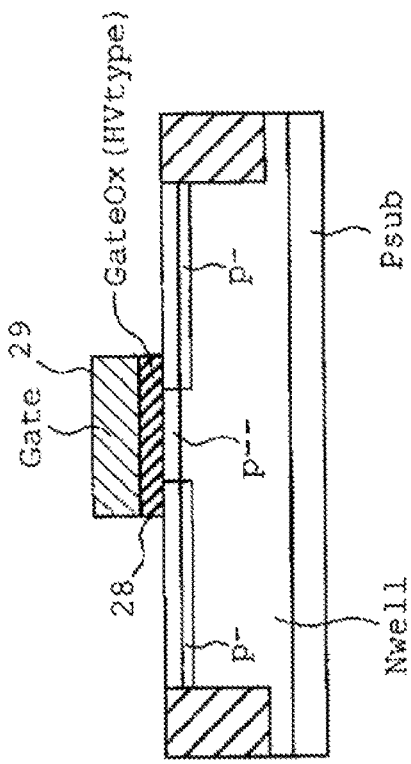
Figure 12D:
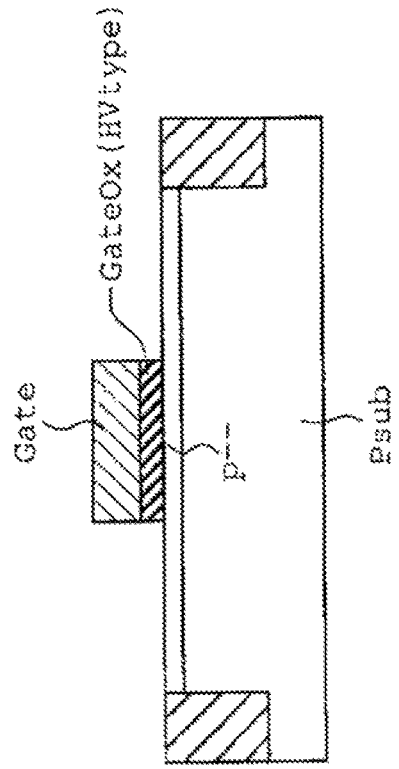
Figure 13A:
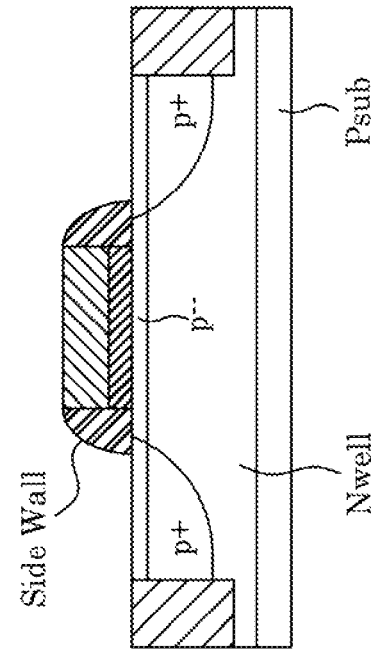
FIGS. 13A to 13D are examples illustrating manufacturing methods of various MOS transistors (third) and configurations according to the embodiment.
Figure 13B:
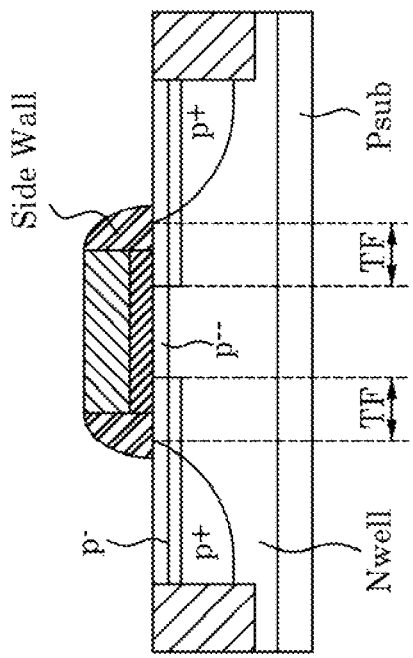
Figure 13C:
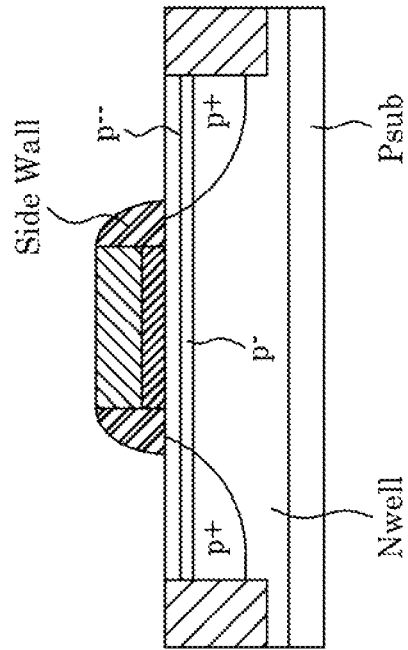
Figure 13D:
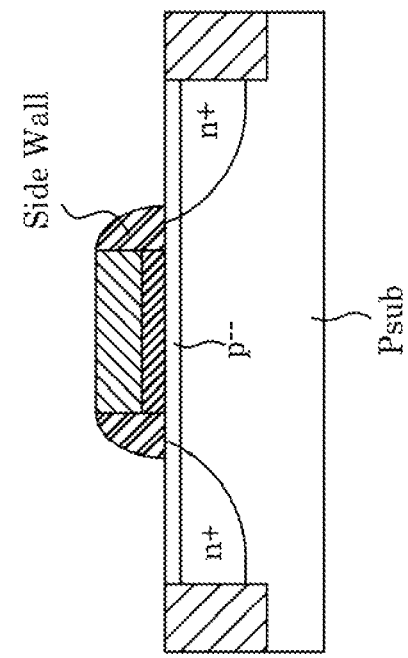

Subsequently, the manufacturing method of the transistors of the peripheral circuit in the non-volatile semiconductor memory device is described with reference to FIGS. 11A to 13D. In the drawings, FIGS. 11A, 12A, and 13A illustrate the manufacturing step of the transistor HP, FIGS. 11B, 12B, and 13B illustrate the manufacturing step of the second high withstand voltage p-channel MOS transistor, FIGS. 11C, 12C, and 13C illustrate the manufacturing step of the high withstand voltage n-channel MOS transistor, and FIGS. 11D, 12D, and 13D illustrate the manufacturing step of the low withstand voltage p-channel MOS transistor (all are enhancement-type). Additionally, these transistors are illustrated to represent only some of the plural elements configuring the peripheral circuit.

First, as illustrated in FIGS. 11A, 11B, and 11D, ion implantation is performed on upper portions of the p-type semiconductor substrates by using, for example, phosphorus (P) or arsenic (As) as dopants, so that the n-type wells 23 or the like are formed. At this point, dopants such as boron (B) may be doped at the same time.

Subsequently, channel implantation is performed on all the transistors by using, for example, boron (B) as dopants, so that the $p^{--}$ region 25 (first peak dopant concentration) is formed. Thereafter, the $p^-$ regions 26 ($p^-$, third peak dopant concentration) are formed by channel implantation on the transistor of FIG. 11A, and also the $p^-$ region 26 (fourth peak dopant concentration) is formed on the low withstand voltage p-type transistor of FIG. 11D. Here, the $p^-$ region 26 is formed on at least the region right below the gate electrode 29 of the low withstand voltage p-type transistor so that the threshold voltage of the low withstand voltage p-type transistor is adjusted by the $p^{--}$ region 25 and the $p^-$ region 26 to either side thereof.

The $p^-$ regions 26 of FIG. 11A are formed on the surface of the semiconductor substrate by, for example, a photolithography technique, by using a photoresist as a mask, so as to extend to portions directly below end portions of the region in which the gate electrode 29 is formed thereafter. That is, the overlap regions TF are formed near an end portion on the drain side of the gate electrode 29 and near an end portion of the source side of the gate electrode 29, except for a central portion right below the gate electrode 29. Subsequently, the STI element separation regions, 22 having a thickness of, for example, 0.2 μm to 0.5 μm, are formed in all the transistors.

Subsequently, as illustrated in FIGS. 12A to 12D, the gate insulation films 28 are formed, and the gate electrodes 29 are formed over the gate insulation films. The gate insulation films of the high withstand voltage transistors in FIGS. 12A to 12C are thicker than the thickness of the gate insulation films of the low withstand voltage transistor. Then, the side wall insulation films 30 are formed on both sides of the gate electrode 29, by using, for example, a silicon nitride film or a silicon oxide film. Subsequently, as illustrated in FIGS. 13A to 13D, ion implantation is performed by using, for example, boron (B) as dopants and by using the gate electrodes 29 and the side wall insulation films 30 as masks in a self-aligned manner, so that the $p^+$ regions 24 are formed on the transistors in FIGS. 13A, 13B, and 13D. As a result, the source drain diffusion regions KK ($p^+$, second and fifth peak dopant concentrations) are formed in a self aligned manner with respect to the outer end of the side wall insulation films 30. In addition, on the transistor of FIG. 13C, ion implantation is performed by using, for example, arsenic (As) as dopants and by using the gate electrode 29 and the side wall insulation films 30 as masks in a self-aligned manner, so that the source drain regions ($n^+$) are formed.

Lastly, though not illustrated, it is possible to form a contact region by performing the ion implantation by using, for example, boron (B), on one portion of the source drain region. As a result, each transistor is completed. According to the embodiment described above, with respect to the p-channel MOS transistor HP configuring the voltage switching circuit 54A which is a peripheral circuit of a NAND-type flash memory, the overlap regions TF are formed between the channel region CN and the source drain diffusion regions KK near a portion right below the opposed ends of the gate electrode 29. According to this, electron holes pairs are easily accumulated at the gate terminal in the source drain direction of the gate insulation film 28, and it is possible to prevent change of the threshold value of the transistor HP or the decrease of the current driving capability thereof.

In this case, since the overlap regions TF are formed so as to protrude from the end portions of the gate electrode 29 (from the source drain regions KK) by 50 nm or more, the aforementioned effects may be securely achieved in the end portions on the source side and the drain side of the channel region CN.

The overlap regions TF may be formed without increasing implant steps, by simultaneously performing ion implantation for adjusting the threshold voltage of the low withstand voltage p-type MOS transistor during the ion implantation for forming the $p^-$ regions 26.

Additionally, the voltage switching circuit 54A has the p-channel high withstand voltage MOS transistor HP including the overlap regions TF together with the n-channel depletion-type high withstand voltage MOS transistor HND1. Accordingly, it is possible to prevent the decrease of the voltage applied to the gate electrode of the transfer transistors QN caused by the deterioration of the p-channel high withstand voltage MOS transistor HP.

Modification Example 1

Figure 14:
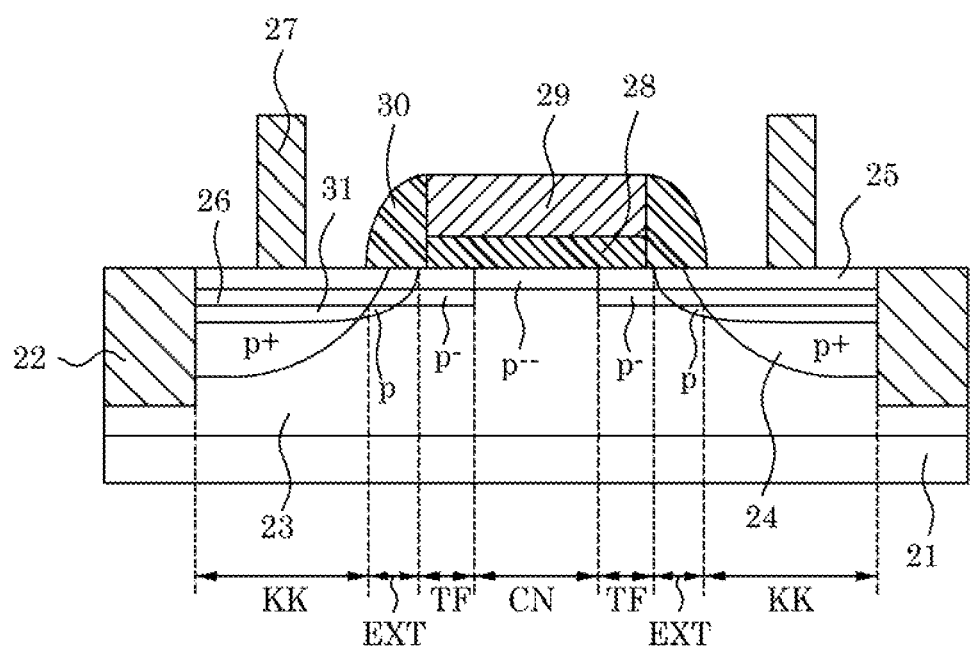
FIG. 14 is an example of a cross-sectional view schematically illustrating the configuration of the high withstand voltage p-channel MOS transistor according to a modification example of the embodiment.

It is possible configure the p-channel high withstand voltage MOS transistor HP according to the embodiment to have a so-called Lightly Doped Drain (LDD) structure. As illustrated in FIG. 14, additional p regions 31 are included in the LDD structure, and the end portions of the p regions 31 extending toward the gate electrode 29 are positioned near the border of the gate electrode 29 and the side wall insulation films 30. Here, extension regions EXT are regions in which the p regions 31, the p⁻⁻ region 25, and the p⁻ regions 26 overlap, and they are formed to extend from the element separation insulation films 22 to directly below the side wall insulation films 30. Here, the concentration in the p region 31 is as follows.

|  | Peak concentration [cm$^{-3}$] | Junction depth |
|---|---|---|
| P regions 31 | 1E+18 to 1E+19 | 250 nm or less |

Figure 15A:
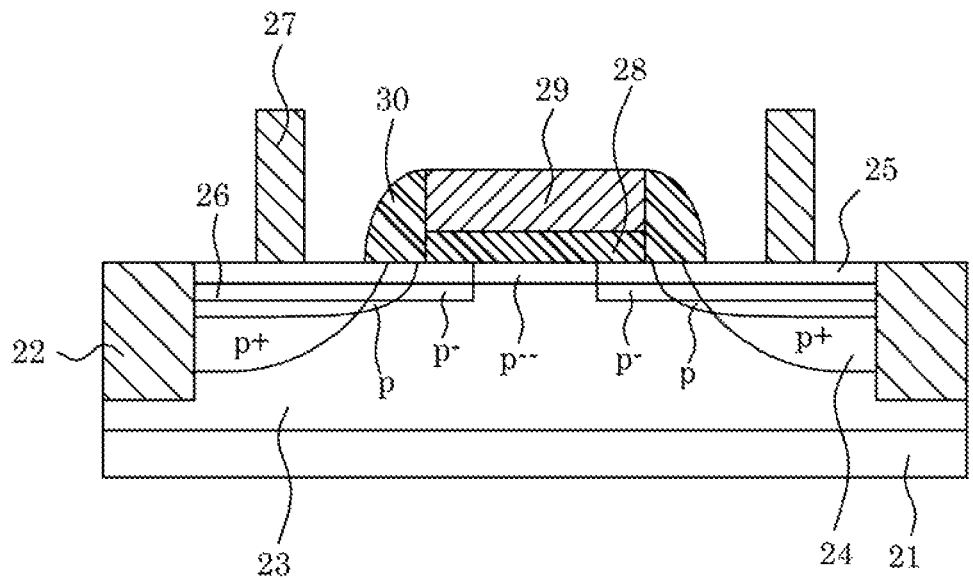
FIG. 15A is a diagram corresponding to FIG. 14.
Figure 15B:
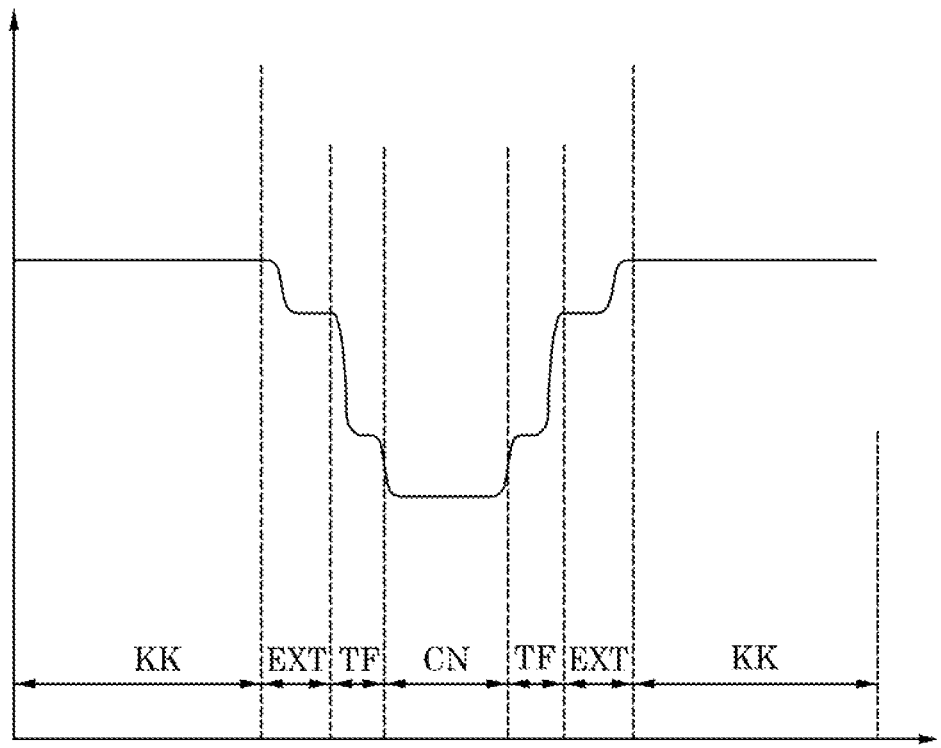
FIG. 15B is an example of a diagram illustrating an distribution state of dopant peak concentrations of the high withstand voltage p-channel MOS transistor according to the modification example of the embodiment.

That is, the p-type peak dopant concentrations of respective regions satisfy that "source drain region KK>extension region EXT>overlapping region TF>channel region CN", as illustrated in FIGS. 15A and 15B.

Even in this configuration, since the overlap regions TF are formed so as to protrude under the end portions of the gate electrode 29 (from the source drain regions KK) by 50 nm or more, it is possible to cause the overlap capacitance to be great. As a result, it is possible to reduce voltage stress induced deterioration the threshold voltage of the high withstand voltage p-channel the transistor HP.

Further, since the extension regions EXT having the p-type peak dopant concentration extending below the overlap regions TF are included, it is possible to cause the working speed to be fast.

In addition, it is possible to also fabricate the transistor HP, the second high withstand voltage p-channel MOS transistor, the high withstand voltage n-channel MOS transistor, and the low withstand voltage p-channel MOS transistor to have the LDD structures, as illustrated in FIGS. 16A to 16D.

Subsequently, the manufacturing method of the transistor of the peripheral circuit in the non-volatile semiconductor memory device is described. First, the manufacturing steps are performed as illustrated in FIGS. 11A to 12D. Next, the p regions 31 (extension regions EXT) are formed by performing the ion implantation on the transistors of FIGS. 12A, 12B, and 12D by using, for example, boron as dopants and by using the gate electrodes 29 as masks in the self-aligned manner. Subsequently, the side wall insulation films 30 are formed by using, for example, silicon nitride films or silicon oxide films on both sides of the gate electrodes 29.

Subsequently, the p⁺ regions 24 are formed on the transistors of FIGS. 13A, 13B, and 13D by performing the ion implantation by using, for example, boron (B) as dopants and by using the gate electrodes 29 and the side wall insulation films 30 as masks in the self-aligned manner. As a result, the source drain regions KK (p⁺, second and fifth peak dopant concentration) are formed. Further, source drain regions (n⁺) are formed on the transistor of FIG. 13C by performing the ion implantation by using, for example, arsenic (As) as dopants and by using the gate electrode 29 and the side wall insulation films 30 as masks in the self-aligned manner.

As a result, it is possible to manufacture the transistors illustrated in FIGS. 16A to 16D.

While certain embodiments have been described, these embodiments have been presented by way of example only, and are not intended to limit the scope of the inventions. Indeed, the novel device and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a memory cell transistor of a memory cell; and
   a peripheral circuit configured to drive the memory cell transistor,
   wherein the peripheral circuit has a p-channel MOS transistor including: a p-type drain region in a semiconductor layer;
      a p-type source region in the semiconductor layer and spaced from the drain region in a first direction;
      a gate electrode on a first gate insulating film, which is on a surface of the semiconductor layer between the p-type drain region and the p-type source region;
      a first element separation region on a drain region side of the gate electrode in the first direction;
      a second element separation region on a source region side of the gate electrode opposite the drain region side in the first direction;
      a channel region at the surface of the semiconductor layer below the gate insulating film, the channel region having a first dopant concentration and a width in the first direction that is less than a width of the gate electrode in the first direction, wherein the p-type source region extends from the second element separation region towards the channel region in the first direction and the p-type drain region extends from the first element separation region towards the channel region in the first direction, the p-type source region and the p-type drain region each comprising a first portion doped with a second dopant concentration that is higher than the first dopant concentration, and a second portion doped with a p-type third dopant concentration higher than the first dopant concentration and lower than the second dopant concentration by at least one order of magnitude; and
      a first overlap region extending from the channel region to the p-type source region and a second overlap region extending from the channel region to the p-type the drain region, the first and second overlap regions meeting the channel region in a location below the gate electrode, the first and second overlap regions comprising a first layer at the surface of the semiconductor layer and a second layer below the first layer, the first layer being doped with the p-type dopant at the first dopant concentration, and the second layer being doped with the p-type third dopant concentration, the first layer having a same depth in the semiconductor layer as the channel region, the second layer having a constant depth and a constant dopant concentration along the first direction from one of the p-type source region or p-type drain region to a position in the semiconductor layer below the gate electrode at which the first layer meets the channel region, the position in the semiconductor layer being at least 50 nm along the first direction from a position of an outer edge of the gate electrode.

2. The non-volatile semiconductor memory device according to claim 1, wherein each of the first and second overlap regions extends a distance along the first direction from the p-type source region or p-type drain region of at least 50 nm.

3. The non-volatile semiconductor memory device according to claim 2,
wherein the first and second overlap regions are separated from one another below the channel region.

4. The non-volatile semiconductor memory device according to claim 1,
wherein the peripheral circuit further includes an n-channel MOS transistor including:
a third gate insulation film having a film thickness equal to the first gate insulating film;
a gate electrode connected to a drain electrode of the p-channel MOS transistor; and
a source electrode connected to a source electrode of the p-channel MOS transistor.

5. The non-volatile semiconductor memory device according to claim 1,
wherein dopant concentration in the first layer of the first and second overlap regions decreases from the p-type source region to the channel region and from the p-type drain region to the channel region, respectively.

6. A non-volatile semiconductor memory device comprising:
a memory cell transistor of a memory cell to which data can be written and from which data can be erased; and
a peripheral circuit configured to drive the memory cell transistor,
wherein the peripheral circuit has a first p-channel MOS transistor including:
a p-type drain region in a semiconductor layer;
a p-type source region in the semiconductor layer and spaced from the p-type drain region in a first direction;
a gate electrode on a first gate insulating film, which is disposed on a surface of the semiconductor layer between the p-type drain region and the p-type source region, the gate electrode at least partially surrounded by a sidewall insulating film;
a first element separation region on a drain region side of the gate electrode in the first direction;
a second element separation region on a source region side of the gate electrode opposite the drain region side in the first direction;
a channel region at the surface of the semiconductor layer below the gate insulating film, the channel region having a first dopant concentration and a width in the first direction that is less than a width of the gate electrode in the first direction, wherein the p-type source region extends from the second element separation region towards the channel region in the first direction and the p-type drain region extends from the first element separation region towards the channel region in the first direction, the p-type source region and the p-type drain region each comprising a first portion doped with a second dopant concentration that is higher than the first dopant concentration, and a second portion doped with a p-type third dopant concentration higher than the first dopant concentration and lower than the second dopant concentration by at least one order of magnitude; and
a first overlap region extending from the channel region to the p-type source region and a second overlap region extending from the channel region to the p-type drain region, the first and second overlap regions meeting the channel region in a location below the gate electrode, the first and second overlap regions comprising a first layer at the surface of the of the semiconductor layer and a second layer below the first layer, the first layer being doped with the p-type dopant at the first dopant concentration and the second layer being doped with the p-type third dopant concentration, the first layer having a same depth in the semiconductor layer as the channel region, the second layer having a constant depth and a constant dopant concentration along the first direction from one of the p-type source region or p-type drain region to a position in the semiconductor layer below the gate electrode at which the first layer meets the channel region, the position in the semiconductor layer being at least 50 nm along the first direction from a position of an outer edge of the gate electrode.

7. The non-volatile semiconductor memory device according to claim 6,
wherein each of the first and second overlap regions extends a distance along the first direction from the p-type source or p-type drain region of at least 50 nm.

8. The non-volatile semiconductor memory device according to claim 7,
wherein the first and second overlap regions are separated from one another below the channel region.

9. The non-volatile semiconductor memory device according to claim 6,
wherein the peripheral circuit further includes an n-channel MOS transistor including:
a third gate insulation film having a film thickness equal to the first gate insulating film;
a gate electrode connected to a drain electrode of the p-channel MOS transistor; and
a source electrode connected to a source electrode of the p-channel MOS transistor.

10. The non-volatile semiconductor memory device according to claim 6,
wherein dopant concentration in the first layer of the first and second overlap regions decreases from the p-type source region to the channel region and from the p-type drain region to the channel region, respectively.

11. The non-volatile semiconductor memory device according to claim 6, wherein the first overlap region contacts the p-type source region at a first position in the semiconductor layer below the sidewall insulating film.

12. The non-volatile semiconductor memory device according to claim 11, wherein the second overlap region contacts the p-type drain region at a second position in the semiconductor layer below the sidewall insulating film.

13. The non-volatile semiconductor memory device according to claim 6, wherein the second overlap region contacts the p-type drain region at a position in the semiconductor layer below the sidewall insulating film.

* * * * *